United States Patent

Mihashi et al.

Patent Number: 5,838,704
Date of Patent: Nov. 17, 1998

[54] PULSATION LASER HAVING AN ACTIVE REGION WITH A THICKER CENTRAL REGION IN A RESONATOR LENGTH DIRECTION

[75] Inventors: Yutaka Mihashi; Motoharu Miyashita; Shoichi Karakida, all of Tokyo, Japan

[73] Assignee: Mitsubishi Denki Kabushiki Kaisha, Tokyo, Japan

[21] Appl. No.: 649,447

[22] Filed: May 17, 1996

[30] Foreign Application Priority Data

Nov. 24, 1995 [JP] Japan ................................ 7-306104

[51] Int. Cl.⁶ ........................................................ H01S 3/07
[52] U.S. Cl. .................................. 372/45; 372/46; 372/50
[58] Field of Search .................................. 372/45, 46, 50

[56] References Cited

U.S. PATENT DOCUMENTS

| | | | |
|---|---|---|---|
| 5,040,032 | 8/1991 | Kapon | 372/4 |
| 5,166,946 | 11/1992 | Caldwell | 372/50 |
| 5,259,049 | 11/1993 | Bona et al. | 385/50 |
| 5,404,371 | 4/1995 | Kokubo | 372/45 |
| 5,559,819 | 9/1996 | Abe et al. | 372/46 |

FOREIGN PATENT DOCUMENTS 4225586  8/1992  Japan .

OTHER PUBLICATIONS

Goto et al., "Low noise and high–power GaA1As lazers with a saturable absorbing layer", Paper for Meeting of Society of Applied Physics of Japan, Spring, 1995.

*Primary Examiner*—Rodney B. Bovernick
*Assistant Examiner*—Ellen E. Kang
*Attorney, Agent, or Firm*—Leydig, Voit & Mayer, Ltd.

[57] ABSTRACT

A pulsation laser includes an n-type AlGaAs cladding layer on an n-type GaAs substrate, three quantum well active layers having central increased thickness regions and disposed on the cladding layer, and a p-type AlGaAs cladding layer disposed on the quantum well active layer. The increased thickness region of the active layer is not more than one-quarter of the length of the resonator of the laser.

7 Claims, 6 Drawing Sheets

Fig. 1(a)
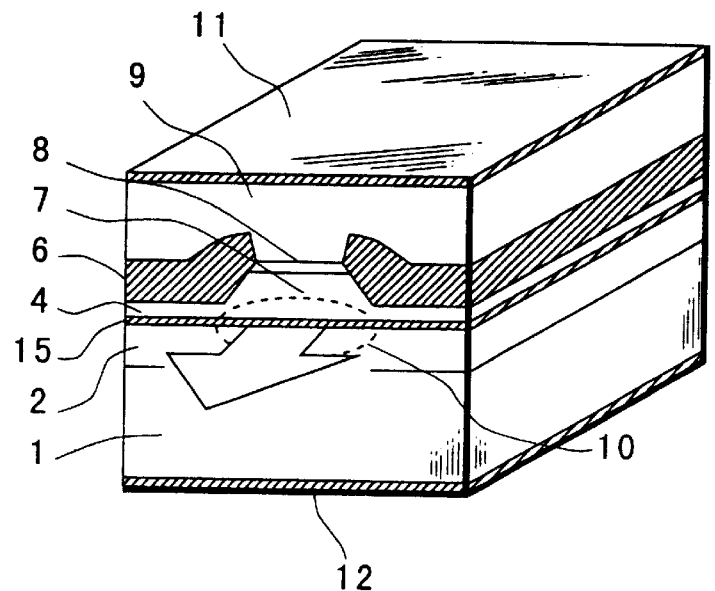
Fig. 1(c)
Fig. 1(b)
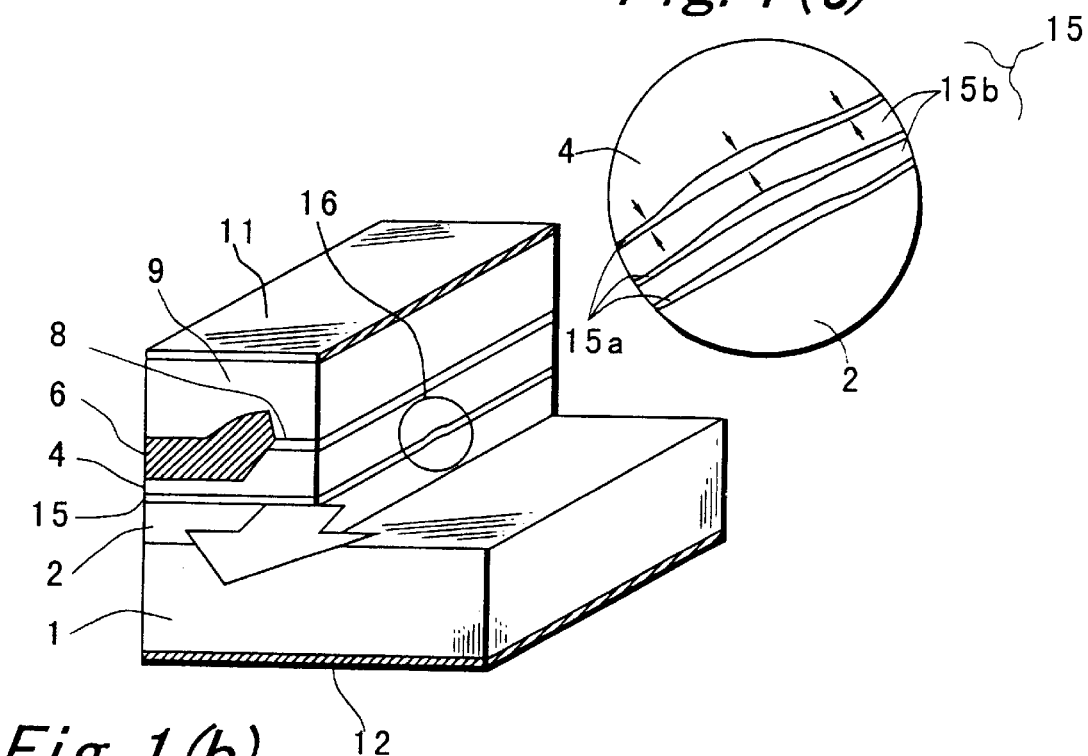

PULSATION LASER HAVING AN ACTIVE REGION WITH A THICKER CENTRAL REGION IN A RESONATOR LENGTH DIRECTION

BACKGROUND OF THE INVENTION

1. Technical Field of the Invention

The present invention relates to a semiconductor laser and, more particularly, to a pulsation laser (self-exciting oscillation laser) which can be used efficiently for reading and writing optical disks.

2. Description of the Background Art

A short wave length semiconductor laser producing light having a wavelength of 0.78 μm, a semiconductor laser producing light having a wavelength of 0.68 μm, etc. are important as key devices in optical disk apparatus, such as an optical disk drive (ODD) or a digital video disk drive (DVD). There are two ways of using these semiconductor lasers with an optical disk, i.e., reading and writing signals. A low noise characteristic with a low power output of about 5 mW is required for reading while a high power output of 30 to 50 mW is required for writing.

Different semiconductor lasers have been employed for reading and writing, respectively. Recently, however, from a viewpoint of cost reduction, one semiconductor laser is used for both functions. In reading an optical disk, noise is generated due to light returning to the semiconductor laser from the optical system. Therefore, a semiconductor laser that operates in a pulsation manner, i.e., self-exciting oscillation (hereinafter referred to as pulsation laser), is essentially required to restrain such noise generation.

This invention relates to a pulsation laser operating in a pulsation manner at a low power output and also achieving a high power output of 30 to 50 mW. This invention also relates to a method of manufacturing the pulsation laser.

FIG. 3 is a perspective view showing a pulsation laser described in the preparatory papers for the 41st Applied Physics Association Lecture Meeting, Spring 1994, No.3, p.990, speech No. 28, p-K-9. As shown in FIG. 3, a pulsation laser comprises an n-type GaAs substrate 1, an n-type $Al_xGa_{1-x}As$ cladding layer 2 (Al composition x=0.48), an $Al_yGa_{1-y}As$ active layer 3 (y=0.13), a p-type $Al_xGa_{1-x}As$ cladding layer 4 (Al composition x=0.48), an $Al_zGa_{1-z}As$ etching stopping layer 5 (also serving as a saturable absorption layer; z=0.13), an n-type $Al_rGa_{1-r}As$ current blocking layer 6 (x=0.7), a p-type $Al_sGa_{1-s}As$ optical guide layer 7 (Al composition s=0.48), a p-type GaAs cap layer 8, a p-type GaAs contact layer 9, an active region 10, an electrode 11, and an electrode 12.

Each of layers 2 to 5, 7, and 8 is grown epitaxially, in that order, on the GaAs substrate 1 by metal organic chemical vapor deposition (MOCVD). Then, by use of photolithography and etching, the AlGaAs light guide layer 7 is selectively etched to reach the AlGaAs etching stopping layer 5, whereby a ridge-like stripe is formed. Subsequently, after growing the AlGaAs current blocking layer 6 and the GaAs contact layer 9, the electrodes 11 and 12 are formed.

In the conventional pulsation laser of this construction, a positive voltage is applied to the electrode 11 and a negative voltage is applied to the electrode 12. Then, holes are injected from the AlGaAs cladding layer 4 into the active region 10 of the AlGaAs active layer 3 and electrons are injected from the AlGaAs cladding layer 2. Thus, light emission takes place due to recombination of the holes and electrons. When the current exceeds a threshold level, laser oscillation begins.

In laser oscillation, the light emitted from the active region 10 of the AlGaAs active layer 3 is transmitted to the AlGaAs cladding layer 4 and reaches the AlGaAs etching stop layer 5. Since the band gap energy of the AlGaAs etching stopping layer 5 is substantially the same as that of the AlGaAs active layer 3, the laser light is absorbed in the AlGaAs etching stopping layer 5.

When increasing current is applied to the semiconductor laser, increasing the laser light intensity, the AlGaAs etching stopping layer 5 reaches an absorption limit (i.e., becomes saturated) and becomes, effectively, transparent to the laser light. In other words, the AlGaAs etching stopping layer 5 no longer functions as a saturable absorption layer. In the semiconductor laser which includes an absorption layer, the two processes of the light absorption and loss of the absorption characteristic by the saturable absorption layer are repeated at a high speed. Accordingly, so-called pulsation (self-exciting) oscillation is achieved in which laser light intensity and spectral content fluctuate at a high speed.

In the conventional pulsation laser having this construction, the saturable absorption layer is located near the active region 10 over the entire length of the resonator. Therefore, light is significantly absorbed, resulting in an increase in the threshold current, lowering oscillation efficiency, and increasing operating current. Consequently, it has been difficult to achieve a pulsation laser of high reliability, capable of operating at a high power output.

Moreover, to produce a pulsation laser that satisfies every characteristic required, further problems exist in that it is essential to control the Al composition of the saturable absorption layer precisely with sufficient reproducibility at a level equal to the aluminum content of the AlGaAs active layer 3 and further to control the layer thickness accurately.

Accordingly, from the viewpoint of mass production of a semiconductor laser, it has been desired to produce a laser construction capable of operating at high speed and performing pulsation oscillation with high reproducibility at a low power output and to provide a process for manufacturing a laser with such a structure.

SUMMARY OF THE INVENTION

The present invention was made to solve the above-discussed problems and has an object of producing a pulsation laser preventing an increase in threshold current, a reduction in oscillation efficiency, an increase in operating current, and capable of operating at a high power output while achieving pulsation with high reproducibility.

Another object of the invention is to provide a method of manufacturing such a pulsation laser.

A further object of the invention is to provide a light logic circuit employing such a pulsation laser.

A pulsation laser according to the invention comprises an active layer including at least one quantum well layer having a thicker central region and thinner regions adjacent the central region.

A pulsation laser according to the invention may have a plurality of quantum well layers.

A pulsation laser according to another aspect of the invention includes a quantum well layer of the active layer of a compound semiconductor material selected from the group consisting of GaAs, AlGaAs, GaInP, and AlGaInP.

According to the invention, the thicker central region of the active layer of a pulsation laser has a length not more than one-quarter of the length of the resonator of the laser.

Another aspect of the invention is a process for manufacturing a pulsation laser which comprises forming a pair of island-like selective growth masks on a semiconductor substrate on opposite sides of a center axis of the resonator; epitaxially growing a lower cladding layer; epitaxially growing the active layer including a quantum well layer; and epitaxially growing the upper cladding layer.

Another aspect of the invention is a process for manufacturing a pulsation laser wherein the selective growth masks are formed of one of $SiO_2$, SiN, and SiON, and epitaxially growing the lower cladding, active, and upper cladding layers by metal organic chemical vapor deposition.

Another aspect of the invention is epitaxially growing the lower cladding layer in the presence of hydrogen chloride gas.

BRIEF DESCRIPTION OF THE DRAWINGS

A more complete appreciation of the present invention and many of the attendant advantages thereof will be readily obtained as the same becomes better understood by reference to the following detailed description in connection with the accompanying drawings, wherein:

FIG. 1(a) is a perspective view of a pulsation laser in accordance with the present invention.

FIG. 1(b) and 1(c) are partially sectioned views of a pulsation laser in accordance with the present invention.

DETAILED DESCRIPTION OF THE PREFERRED EMBODIMENTS

Figure 2A:
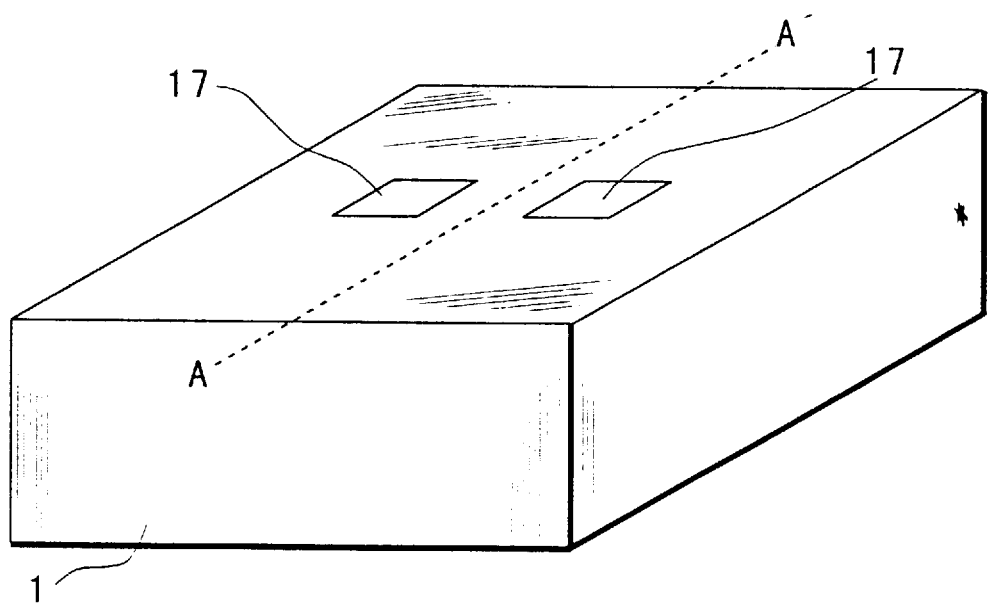
FIGS. 2(a), 2(b1), 2(b2), 2(b'1), 2(b'2), 2(c), and 2(d) are views showing a manufacturing process in accordance with the invention.

FIGS. 1(a) and 1(b) are views showing a pulsation laser in accordance with the present invention and in which FIG. 1(a) is a perspective view and FIG. 1(b) is a partially sectioned perspective view, with an enlarged partial view, showing a laser structure partially sectioned in the direction of the resonator for better understanding of the variation in thickness of the active layer inside the laser.

In the drawing, a pulsation laser comprises an n-type GaAs substrate 1, an n-type $Al_xGa_{1-x}As$ cladding layer 2 (Al composition x=0.48), a p-type $Al_xGa_{1-x}As$ cladding layer 4 (Al composition x=0.48), an n-type $Al_zGa_{1-z}As$ current blocking layer 6 (z=0.7), a p-type $Al_rGa_{1-r}As$ optical guide layer 7 (Al composition r=0.48), a p-type GaAs cap layer 8, a p-type GaAs contact layer 9, an active region 10, an electrode 11, and an electrode 12.

The pulsation laser further comprises a quantum well active layer 15 comprising $Al_sGa_{1-s}As$ (Al composition s=0.05). The quantum well active layer 15 includes three quantum well layers 15a with increased thickness at the center of the laser. The three quantum well layers 15a are separated by respective AlGaAs barrier layers 15b and sandwiched between the n-type AlGaAs cladding layer 2 and the p-type AlGaAs cladding layer 4. Accordingly, the quantum well active layer 15 has an enlarged thickness region 16.

In the pulsation laser having this structure, laser oscillation occurs as follows. When applying a positive voltage to the electrode 11 and a negative voltage to the electrode 12, holes are injected from the p-type AlGaAs cladding layer 4 into the active region 10 of the AlGaAs active layer 3 and electrons are injected from the n-type AlGaAs cladding layer 2 into the active region 10, whereby light emission takes place due to recombination of the holes and electrons. When the current is increased to exceed a threshold level, laser oscillation is initiated.

In the pulsation laser shown in FIGS. 1(a) and 1(b), there is no saturable absorption layer as in the conventional device. The active layer 15 comprises multiple quantum well layers 15a, and, furthermore, the thickness of the quantum well layers 15a is locally or partially increased inside the resonator as compared with the remaining part as shown in FIGS. 1(a) and 1(b). In this embodiment, the quantum well active layer 15 is comprised of $Al_sGa_{1-s}As$ (Al composition s=0.05) and, as shown in the enlarged view of FIG. 1(b), the thickness of the quantum well active layer 15 is also increased in this region. The effective band gap energy of the quantum well becomes smaller when the thickness of the quantum well layers 15a becomes larger.

Accordingly, the increased thickness region 16 of the thickened active layer (or thickened quantum well layer) 15 has a smaller band gap energy than the remaining regions and absorbs the light generated in other regions. The degree of absorption depends upon the length of the region and the thickness of the quantum well layers 15a. When the length of the increased thickness region 16 and the thickness of the quantum well active layer 15 are established at appropriate values, the increased thickness region 16 serves effectively as a saturable absorbent with respect to laser light oscillating inside the resonator without any large loss. Thus, a pulsation oscillation of high yield is obtained.

The length of a resonator of a high power laser for an optical disk is generally 400 to 600 $\mu$m or so, and it is preferable that the length of the increased thickness region 16 of the quantum well layer 15 not be longer than one-quarter (one-fourth) of the resonator length, i.e., not longer than 100 to 150 $\mu$m, and, more preferably, not longer than 50 $\mu$m.

A theoretical calculation shows the following when considering quantum effects. When the thickness of the quantum well active layer 15 is 45 Å in the flat portion and 90 Å, i.e., about twice as thick as the flat portion, in the increased thickness region 16, the band gap energy is reduced from 1.588 eV to 1.530 eV, i.e., by about 60 meV. In other words, the corresponding wavelength is elongated from 780 nm to 810 nm.

In this embodiment, the Al composition of the AlGaAs quantum well active layer 15 is taken as s=0.05. This value is a design parameter to make the oscillation wavelength 0.78 $\mu$m. The Al composition is not limited to this value and can be any appropriate value depending on the intended oscillation frequency.

Next, a process of manufacturing a pulsation laser in accordance with the present invention is described.

FIGS. 2(a) to 2(d) are perspective views showing a process of manufacturing a pulsation laser in accordance with the present invention.

First, as shown in FIG. 2(a), a pair of island-like selective growth masks 17 is formed on the n-type GaAs substrate 1 using a film manufacturing technique or photomasking technique. The selective growth masks 17 are rectangular in this embodiment and comprise $SiO_2$, SiN, or SiON. The selective growth masks 17 are disposed so that a central axis A-A' that becomes a light waveguide within the semiconductor laser is between the masks.

Next, as shown in FIG. 2(b), an n-type $Al_xGa_{1-x}As$ cladding layer 2 (Al composition x=0.48; 1.0 $\mu$m thick), a quantum well active layer 15 (quantum well structure including $Al_{0.05}Ga_{0.95}As$ quantum well layers 45 Å thick and $Al_{0.3}Ga_{0.7}As$ barrier layers 60 Å thick), a p-type $Al_xGa_{1-}$ $_x$As cladding layer 4 (Al composition x=0.48; 1.5 μm thick), and a p-type GaAs cap layer 8 (0.3 μm thick) are epitaxially grown successively on the n-type GaAs substrate 1 by metal organic chemical vapor deposition (MOCVD). In the drawing, the p-type GaAs cap layer 8 of FIG. 1 is not illustrated in FIG. 2(b) for simplification.

Figure 2:
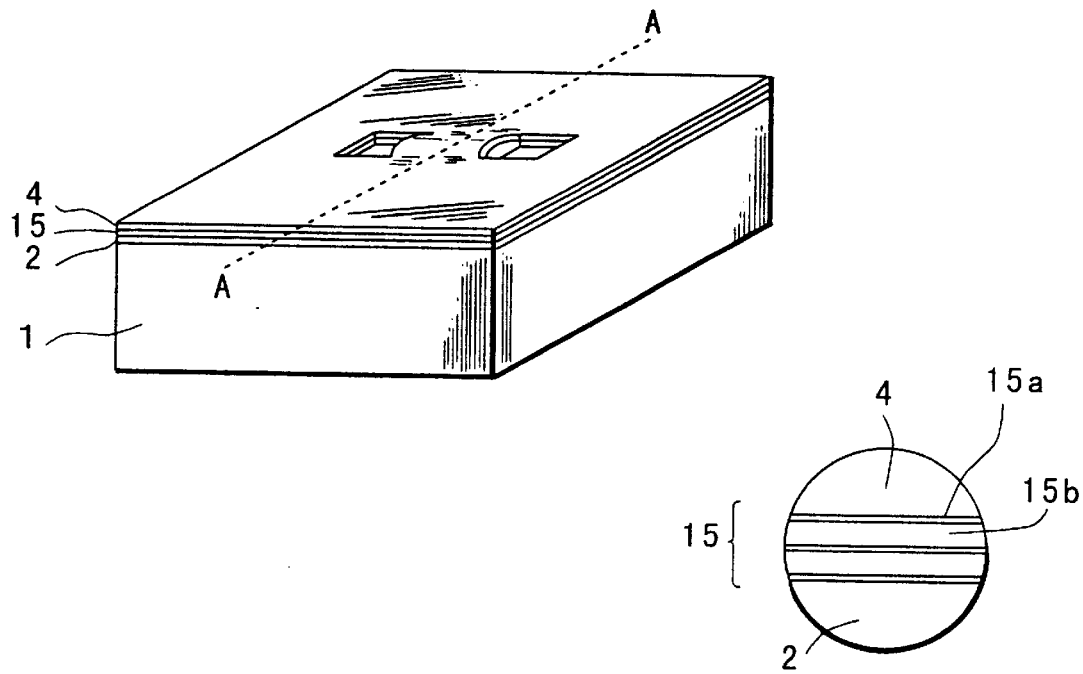
Figure 2:
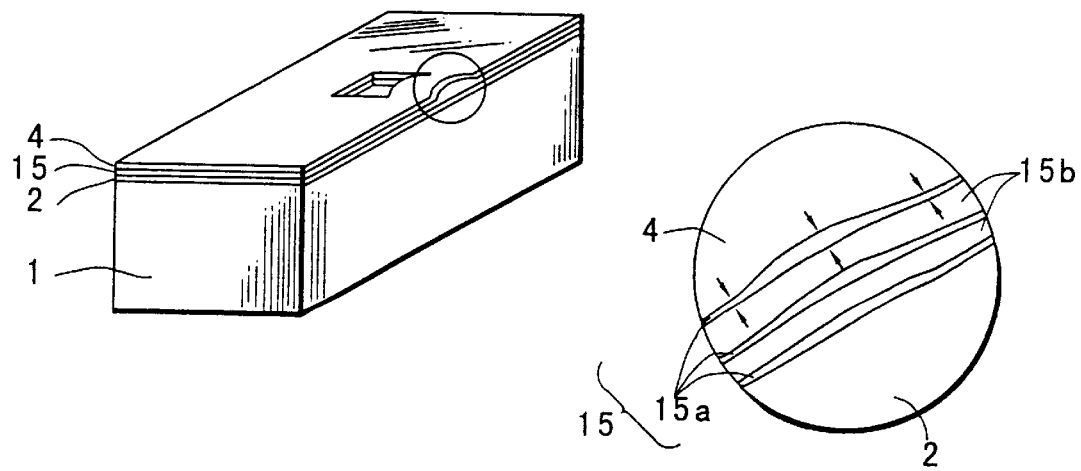

In this process, growth species (Al, Ga, etc.) in the vapor do not grow on the selective growth masks 17 and are swept from the masks 17 to the surrounding area. Those growth species are actually diffused into the region nearby the masks 17 and contribute to the growth around the masks 17. Consequently, the growth rate is increased between the two island-like selective growth masks 17 as compared with other regions, resulting in an increased thickness region 16 as shown in FIG. 2(b'). Accordingly, the thickness of the quantum well layers 15a in the quantum well active layer 15 is increased at this portion, and a saturable absorption layer is formed.

The increase in the layer thickness depends upon the width Wm, length Lm, and gap Wo of the two selective growth masks 17. More specifically, when the width Wm=50 μm, length Lm=100 μm, and gap Wo=20 μm, the layer thickness between the two selective growth masks 17 is about 1.5 times as large as the thickness in the region distant from the selective growth masks 17.

Figure 2C:
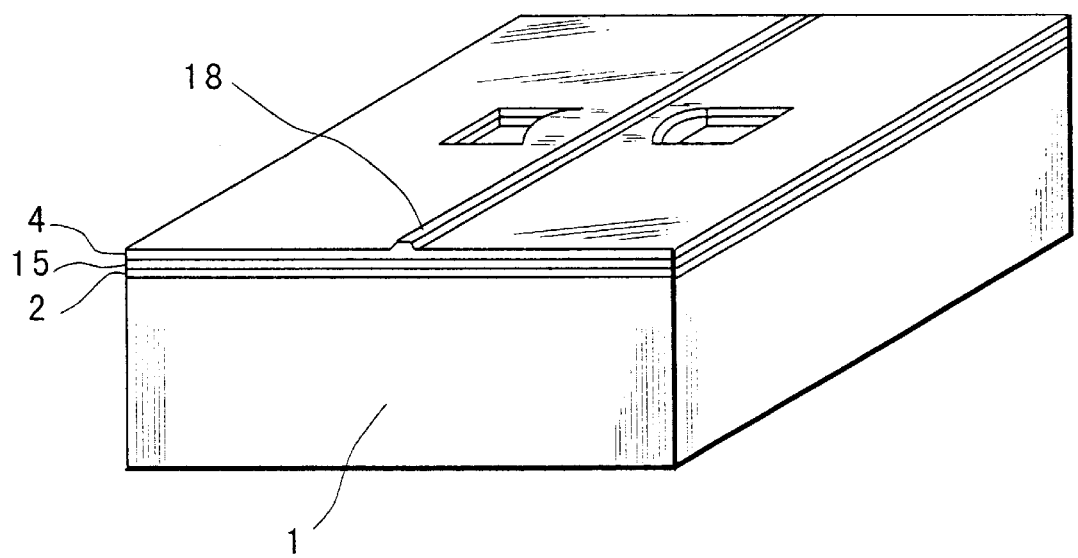

Then, a stripe-shaped mask (not shown) is formed for etching and selective growth on a portion that becomes the light waveguide, and a ridge 18 is formed by etching, as shown in FIG. 2(c).

Figure 2D:
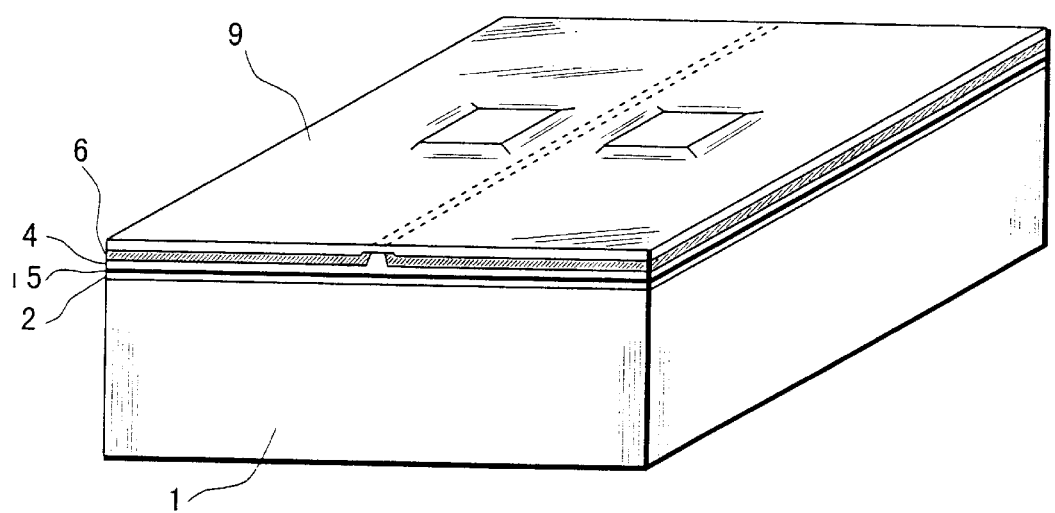
Figure 3:
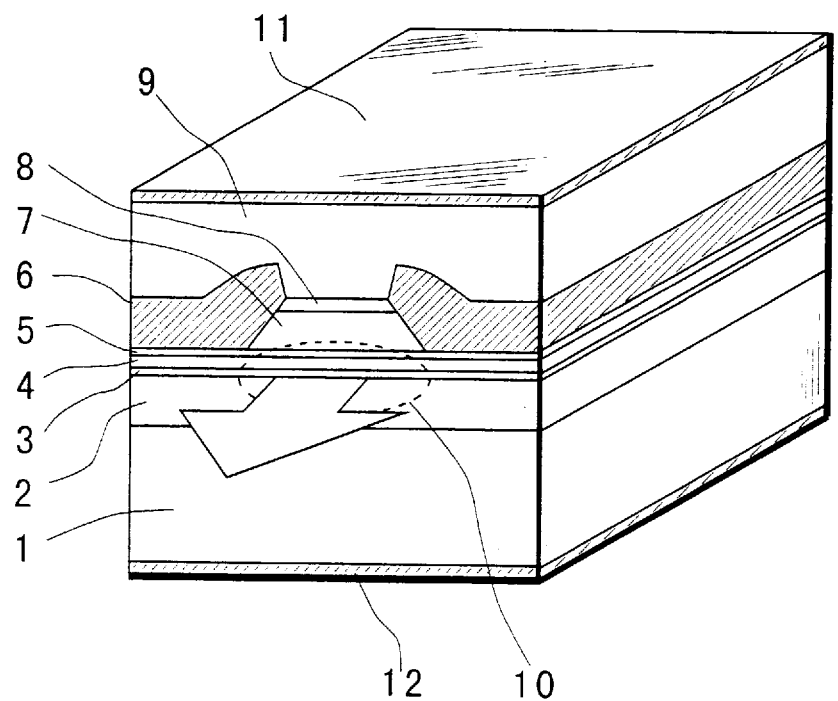
FIG. 3 is a perspective view showing a pulsation laser in accordance with the prior art.

Further, as shown in FIG. 2(d), the n-type AlGaAs current blocking layer 6 is selectively grown, utilizing the stripe-shaped mask, and the p-type GaAs contact layer 9 is formed successively by MOCVD. Thus, a basic structure of the pulsation laser in accordance with the present invention is completed.

Next, another embodiment of the present invention is described.

It may happen that during the process of selective growth in the foregoing embodiment, the thickness of each epitaxial layer as well as the quantum well active layer 15 is increased at the center portion due to the selective growth masks 17. As shown in FIG. 1(b), the thickness of the n-type AlGaAs cladding layer 2 under the increased thickness region 16 of the quantum well active layer 15 is also increased, whereby the quantum well active layer 15 is unnecessarily curved.

As a result, light transmission loss might occur in the quantum well active layer 15, and there is a possibility of impairing the laser characteristic, such as an increase in threshold current.

To prevent such a potential drawback and to improve the characteristics of the pulsation laser, a very small quantity of hydrogen chloride (HCl) is preferably added (about 0.2 cc/min. to the total gas flow of 30 liter/min.) to the source gases at the time of epitaxial growth of the n-type AlGaAs cladding layer 2 by MOCVD.

In this way, the n-type AlGaAs cladding layer 2 under the quantum well active layer 15 grows with a flat surface, and the thickness of the quantum well active layer 15 is only increased in the center region. Consequently, a pulsation laser having a low threshold current and sufficient yield is produced.

In the foregoing embodiments, the short wavelength pulsation laser produces light having a wavelength of 0.78 μm and has a triple quantum well structure. However, the number of quantum well layers is not limited to three. A pulsation laser with either a single or any number of multiple quantum well layers may be used to achieve the same advantage.

It is also possible to employ GaAs as the material of the quantum well layers in which the same advantage is achieved. Further, it is a matter of course that the invention is likewise applicable to a laser producing light having a wavelength of 0.68 μm or 0.65 μm in which the quantum wells are GaInP or AlGaInP.

Furthermore, the shape of the selective growth mask is not limited to the rectangle as shown in the foregoing embodiments, but any other shape such as a circle, trapezoid, or triangle may be employed with the same advantages achieved.

The foregoing embodiments are pulsation lasers. On the other hand, it is also possible to secure a much thicker, for example, more than twice the thickness of the thin region, increased thickness region 16 of a quantum well active layer 15 to increase light absorption, whereby a bistable laser may be achieved. A plurality of bistable lasers may be combined as an optical logic circuit.

Obviously, numerous additional modifications and variations of the present invention are possible in light of the above teachings. It is therefore to be understood that within the scope of the appended claims, the present invention may be practiced otherwise than as specifically described herein.

We claim:

1. A pulsation laser comprising:
    a lower cladding layer extending in a resonator length direction of said pulsation laser;
    an active layer disposed on said lower cladding layer and extending in the resonator length direction, said active layer including at least one quantum well layer, having a thicker central region, and extending along the resonator length direction and thinner regions, on opposite sides of and adjacent the central region, extending along the resonator length direction; and
    an upper cladding layer disposed on said active layer and extending along the resonator length direction.

2. The pulsation laser as set forth in claim 1 including a plurality of quantum well layers.

3. The pulsation laser as set forth in claim 1 wherein said central region has a length along the resonator length direction not more than one-quarter of a total length of said central region and said thinner regions.

4. The pulsation laser as set forth in claim 1 wherein said quantum well layer of said active layer is a compound semiconductor material selected from the group consisting of GaAs, AlGaAs, GaInP, and AlGaInP.

5. The pulsation laser as set forth in claim 1 wherein said lower cladding layer, said active layer, and said upper cladding layer are AlGaAs and said quantum well layer has an aluminum composition chosen to produce a design wavelength.

6. The pulsation laser as set forth in claim 1 wherein said lower cladding layer is planar.

7. The pulsation laser as set forth in claim 1 including a semiconductor substrate having a planar surface on which said lower cladding layer and said active layer are successively disposed, said lower cladding and active layers being substantially planar.

* * * * *